United States Patent
Zhang et al.

(10) Patent No.: US 11,742,849 B2
(45) Date of Patent: Aug. 29, 2023

(54) RAPID TURN-OFF CIRCUIT IN STATIC TRANSFER SWITCH

(71) Applicant: ABB Schweiz AG, Baden (CH)

(72) Inventors: Yuzhi Zhang, Apex, NC (US); Xiaoqing Song, Apex, NC (US); Veerakumar Bose, Henrico, VA (US)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 17/510,299

(22) Filed: Oct. 25, 2021

(65) Prior Publication Data

US 2023/0128049 A1 Apr. 27, 2023

(51) Int. Cl.
| | |
|---|---|
| H03K 17/60 | (2006.01) |
| H03K 17/72 | (2006.01) |
| H02J 3/00 | (2006.01) |
| H03K 17/04 | (2006.01) |
| H03K 17/06 | (2006.01) |
| H01L 29/74 | (2006.01) |

(52) U.S. Cl.
CPC ......... *H03K 17/60* (2013.01); *H01L 29/7408* (2013.01); *H02J 3/007* (2020.01); *H03K 17/0403* (2013.01); *H03K 17/06* (2013.01); *H03K 17/72* (2013.01)

(58) Field of Classification Search
CPC .... H03K 17/60; H03K 17/0403; H03K 17/06; H03K 17/72; H02J 3/007; H01L 29/7408
USPC ......................................................... 307/115
See application file for complete search history.

(56) References Cited

U.S. PATENT DOCUMENTS

| | | |
|---|---|---|
| 7,589,438 B2 | 9/2009 | Galm |
| 8,508,890 B2 | 8/2013 | Zheng |
| 2007/0230228 A1* | 10/2007 | Mao ..................... H02M 3/1588 363/89 |

FOREIGN PATENT DOCUMENTS

WO 2016003357 A1 1/2016

OTHER PUBLICATIONS

P. Cheng and Y. Chen, "Design of an Impulse Commutation Bridge for the Solid-State Transfer Switch," in IEEE Transactions on Industry Applications, vol. 44, No. 4, pp. 1249-1258, Jul.-Aug. 2008.

(Continued)

*Primary Examiner* — Tomi Skibinski
(74) *Attorney, Agent, or Firm* — Armstrong Teasdale LLP

(57) ABSTRACT

Disclosed herein is a hybrid resonant capacitor circuit including a first capacitor configured to discharge resonant current to interrupt a load current to a switch in parallel with the hybrid resonant capacitor circuit, a second capacitor coupled in parallel with the first capacitor, wherein the second capacitor is configured to transfer energy stored in the second capacitor to the first capacitor after discharge of the resonant current from the first capacitor, and a current limiter coupled in series with the second capacitor. A static transfer switch including a thyristor switch and the hybrid resonant capacitor circuit is also disclosed herein, as is a method for facilitating multiple consecutive voltage source transfers between a first voltage source and a second voltage source powering a load, using the hybrid resonant capacitor circuit.

20 Claims, 16 Drawing Sheets

(56) References Cited

OTHER PUBLICATIONS

C. Meyer and R. W. De Doncker, "Solid-state circuit breaker based on active thyristor topologies," in IEEE Transactions on Power Electronics, vol. 21, No. 2, pp. 450-458, Mar. 2006.

Y. Guo, G. Wang, D. Zeng, H. Li and H. Chao, "A Thyristor Full-Bridge-Based DC Circuit Breaker," in IEEE Transactions on Power Electronics, vol. 35, No. 1, pp. 1111-1123, Jan. 2020.

\* cited by examiner

RAPID TURN-OFF CIRCUIT IN STATIC TRANSFER SWITCH

FIELD OF THE DISCLOSURE

The present disclosure relates generally to static transfer switches. In particular, the present disclosure relates to a rapid turn-off circuit in a static transfer switch.

BACKGROUND

A static transfer switch (STS) is a device used to switch from a primary voltage source to an alternate voltage source, and vice versa, when the primary voltage source is unable to power a load. One known STS is depicted in FIG. 1. As depicted in FIG. 1, there are two voltage sources as inputs to an STS 50: the primary source (SRC-1) and the alternate source (SRC-2). An output 52 of the STS 50 connects a delta-to-wye transformer 54, then to a load 56.

In at least some instances, an STS includes high-power solid-state switches 58, such as thyristors. The conventional thyristor is a passive turn-off switch, which requires the conduction current to naturally commutate below the thyristor's minimum holding current and reverse bias voltage to the anode of the thyristor, for a predefined duration of time, to achieve reliable turn-off and effect the switch in voltage sources.

One solution to this limitation is disclosed in co-owned U.S. Pat. No. 11,018,666, which is incorporated by reference herein. FIG. 2 depicts a simplified embodiment of an STS having an auxiliary resonant turn-off (RTO) unit 60 added in parallel to a main switch 62, to force the zero-current turn-off condition. With such an improvement, the turn-off time for the thyristors of the main switch 62 is reduced from up to 8 milliseconds (ms) to less than 1 ms, thereby reducing the total time for the voltage source transfer.

It is realized that it is common for an STS to repeatedly transfer between the two voltage sources multiple times in a short period of time (e.g., five times within a few milliseconds). This repeated source transfer consumes a significant amount of resonant energy, which, in the embodiment depicted in FIG. 2, is stored in a resonant capacitor $C_{r2}$. As the number of consecutive transfers increases, the more energy is needed in $C_{r2}$. However, $C_{r2}$ is limited in its storage capacity, and re-charging $C_{r2}$ between transfers requires a high-current power supply, which can increase both the size and cost of the STS. Alternatively, multiple capacitors in parallel can be substituted for $C_{r2}$, but this arrangement can also be costly and require significant space. Still alternatively, a very large capacitor $C_{r2}$ can be employed to increase the power storage capacity thereof. However, this arrangement can also be very costly, and may cause an overvoltage to the load, from the capacitor $C_{r2}$ when the thyristor is turned off.

BRIEF DESCRIPTION

According to one aspect, a hybrid resonant capacitor circuit includes a first capacitor configured to discharge resonant current to interrupt a load current to a switch in parallel with the hybrid resonant capacitor circuit, a second capacitor coupled in parallel with the first capacitor, wherein the second capacitor is configured to transfer energy stored in the second capacitor to the first capacitor after discharge of the resonant current from the first capacitor, and a current limiter coupled in series with the second capacitor.

According to another aspect, a static transfer switch includes a thyristor switch and a hybrid resonant capacitor circuit connected in parallel to the thyristor switch. The hybrid resonant capacitor circuit includes a first capacitor configured to discharge resonant current to interrupt a load current to the thyristor switch, a second capacitor coupled in parallel with the first capacitor, wherein the second capacitor is configured to transfer energy stored in the second capacitor to the first capacitor after discharge of the resonant current from the first capacitor, and a current limiter coupled in series with the second capacitor.

In a further aspect, a method for facilitating multiple consecutive voltage source transfers between a first voltage source and a second voltage source powering a load includes coupling a main thyristor switch between the load and the first and second voltage sources, and coupling a hybrid resonant capacitor circuit in parallel with the main thyristor switch, the hybrid resonant capacitor circuit including a first capacitor, a second capacitor coupled in parallel with the first capacitor, and a current limiter coupled in series with the second capacitor. The method also includes discharging, by the first capacitor, resonant current to interrupt a load current through the main thyristor switch, and transferring energy stored in the second capacitor to the first capacitor after the discharging.

The foregoing and other aspects, features, details, utilities, and advantages of the present disclosure will be apparent from reading the following description and claims, and from reviewing the accompanying drawings.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein.

Unless otherwise indicated, the drawings provided herein are meant to illustrate features of embodiments of this disclosure. These features are believed to be applicable in a wide variety of systems comprising one or more embodiments of this disclosure. As such, the drawings are not meant to include all conventional features known by those of ordinary skill in the art to be required for the practice of the embodiments disclosed herein.

DETAILED DESCRIPTION OF THE DISCLOSURE

The present disclosure is directed a static transfer switch (STS) including a hybrid resonant turn-off (RTO) unit with a resonant capacitor sub-unit, which enables the STS to function across multiple consecutive voltage source transfers. The hybrid RTO unit is compact and cost-effect relative to other contemplated solutions to the above-references limitations of conventional STSs.

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately", and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

Figure 3:
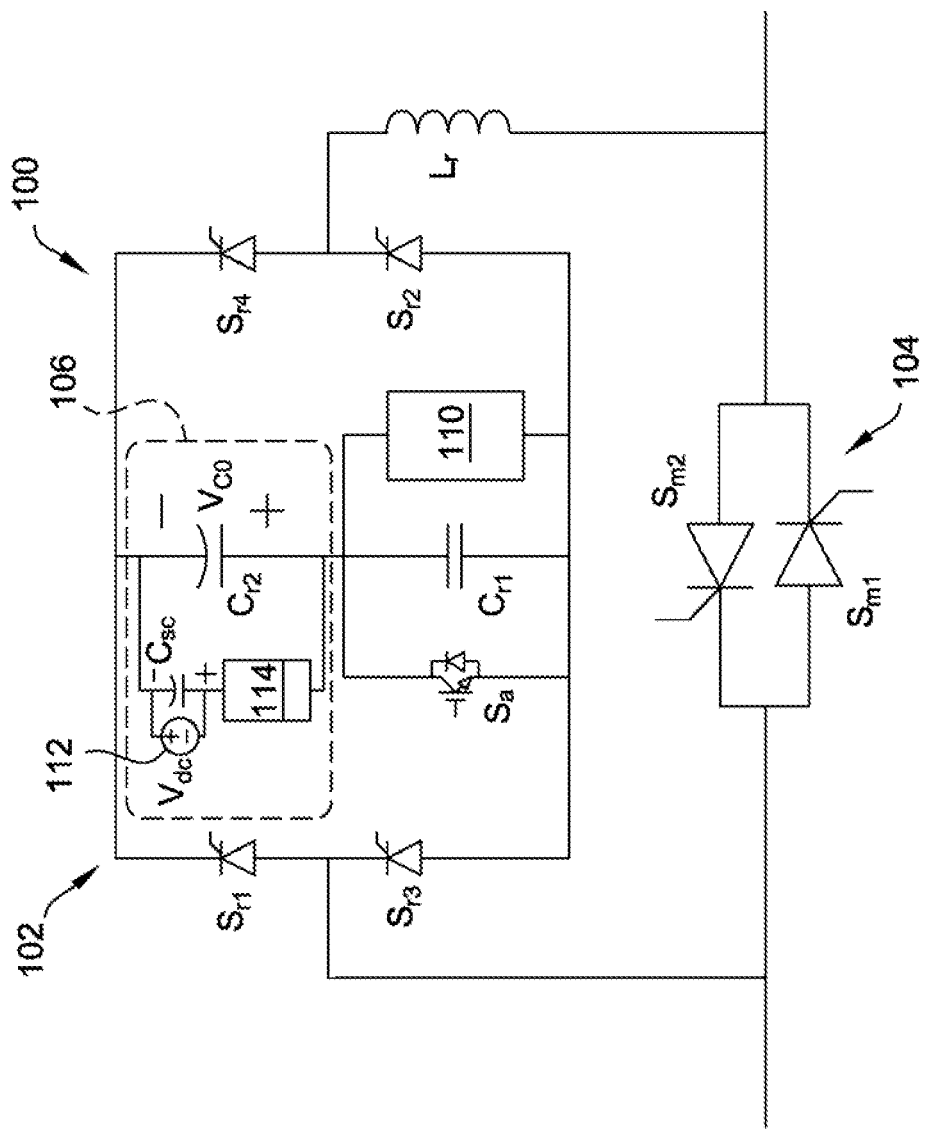
FIG. 3 is a schematic diagram of one example embodiment of an STS including a hybrid RTO unit in parallel with the main thyristor, the hybrid RTO unit including a resonant capacitor sub-unit, in accordance with the present disclosure.

Turning now to the figures, FIG. 3 is a schematic diagram of one example embodiment of an STS 100 including a hybrid RTO unit 102 in parallel with a main switch 104, the hybrid RTO unit 102 including a resonant capacitor sub-unit or circuit 106, in accordance with the present disclosure. The resonant capacitor sub-unit 106 functions as an energy "tank" to enable repeated consecutive voltage source transfers across the STS 100.

The switch 104 includes two main thyristor switches $S_{m1}$ and $S_{m2}$. The hybrid RTO unit 102 includes four auxiliary thyristor switches $S_{r1}$, $S_{r2}$, $S_{r3}$, and $S_{r4}$, as well as one auxiliary semiconductor switch $S_a$ (e.g., an insulated-gate bipolar transistor (IGBT) switch) and a voltage clamping component (e.g., a metal-oxide varistor (MOV)) 110 in parallel with the auxiliary switch $S_a$. In the example embodiment, the hybrid RTO unit 102 has a bridge configuration such that, during a positive half cycle of an AC current (supplied from one of the primary or alternate voltage source), a first pair of the auxiliary thyristor switches (e.g., $S_{r1}$ and $S_{r2}$) are forward biased, whereas a second pair of the auxiliary thyristor switches (e.g., $S_{r3}$ and $S_{r4}$) are forward biased during a negative half cycle of the AC current. The STS 100 also includes a resonant inductor $L_r$ that limits di/dt for soft commutation thereacross.

The hybrid RTO unit 102 also includes a first resonant capacitor $C_1$, and the resonant capacitor sub-unit 106 includes a second resonant capacitor $C_{r2}$ and a "source" capacitor $C_{sc}$. In operation, the capacitor $C_{r1}$ limits dv/dt of the main switch 104, to eliminate false triggers of the main switch 104 that may result from a high dv/dt. The capacitors $C_{r2}$ and $C_{sc}$ are connected in parallel and store the resonant energy used to facilitate multiple consecutive voltage-source transfers across the STS 100.

In the example embodiment, the types of capacitors $C_{r2}$ and $C_{sc}$ are different. In particular, the capacitor $C_{r2}$ is one or more capacitors connected in parallel to implement a capacitor with a high pulse current capability, such as a film capacitor or aluminum capacitor. Therefore, $C_{r2}$ is capable of providing high resonant current, such as thousands of amperes, in a short period of time, such as hundredths of a microsecond (µs). However, the total stored energy in the capacitor $C_{r2}$ is limited, such as from several Joule (J) to about 100 J.

In contrast, the capacitor $C_{sc}$ is one or more high-capacitance capacitors, which can store a large amount of energy. The capacitor $C_{sc}$ may be a super-capacitor or an ultra-capacitor, for example, which can store up to tens of Farads (F) of capacitance, but may have a low voltage rating (e.g., up to about 2-3 $V_{DC}$).

A power supply 112 is connected across the capacitor $C_{sc}$. The power supply 112 is a relatively low power supply—for example, $V_{DC}$ thereof may be up to tens of Watts (W)—to initially charge the capacitor $C_{r2}$ and $C_{sc}$, and to facilitate maintaining the voltage across the capacitors $C_{r2}$ and $C_{sc}$ after these capacitors are discharged during an initial voltage source transfer. The charging current provided by the power supply 112 is limited by a current limiter 114 connected in series with the capacitor $C_{sc}$, for example, to prevent undesirable temperature increase in the capacitor $C_{sc}$. In some embodiments, the current limiter 114 is a resistor. The suitable resistance of the resistor is calculated based on the current rating of the capacitor $C_{sc}$, the limit of allowable temperature increases in the capacitor $C_{sc}$, and the number of individual capacitors employed to implement the capacitor $C_{sc}$. In other embodiments, the current limiter 114 is a semiconductor switch, and the charging current of the capacitor $C_{sc}$ may be actively controlled, within a suitable amplitude, using the semiconductor switch.

In operation, the capacitors $C_{r2}$ and $C_{sc}$ are pre-charged to a relatively low initial voltage. During the voltage source transfer, the sub-unit 106 provides the resonant current to facilitate the turn-off process of the main switch 104. A majority of this current is provided by the capacitor $C_{r2}$, which experiences lower internal resistance than the capacitor $C_{sc}$. Once the main switch 104 is off, the capacitor $C_{r2}$ is rapidly charged by the capacitor $C_{sc}$ and the voltage across the capacitor $C_{r2}$ is therefore increased, enabling the capacitor $C_{r2}$ to discharge appropriately during any subsequent voltage source transfer.

Figure 4:
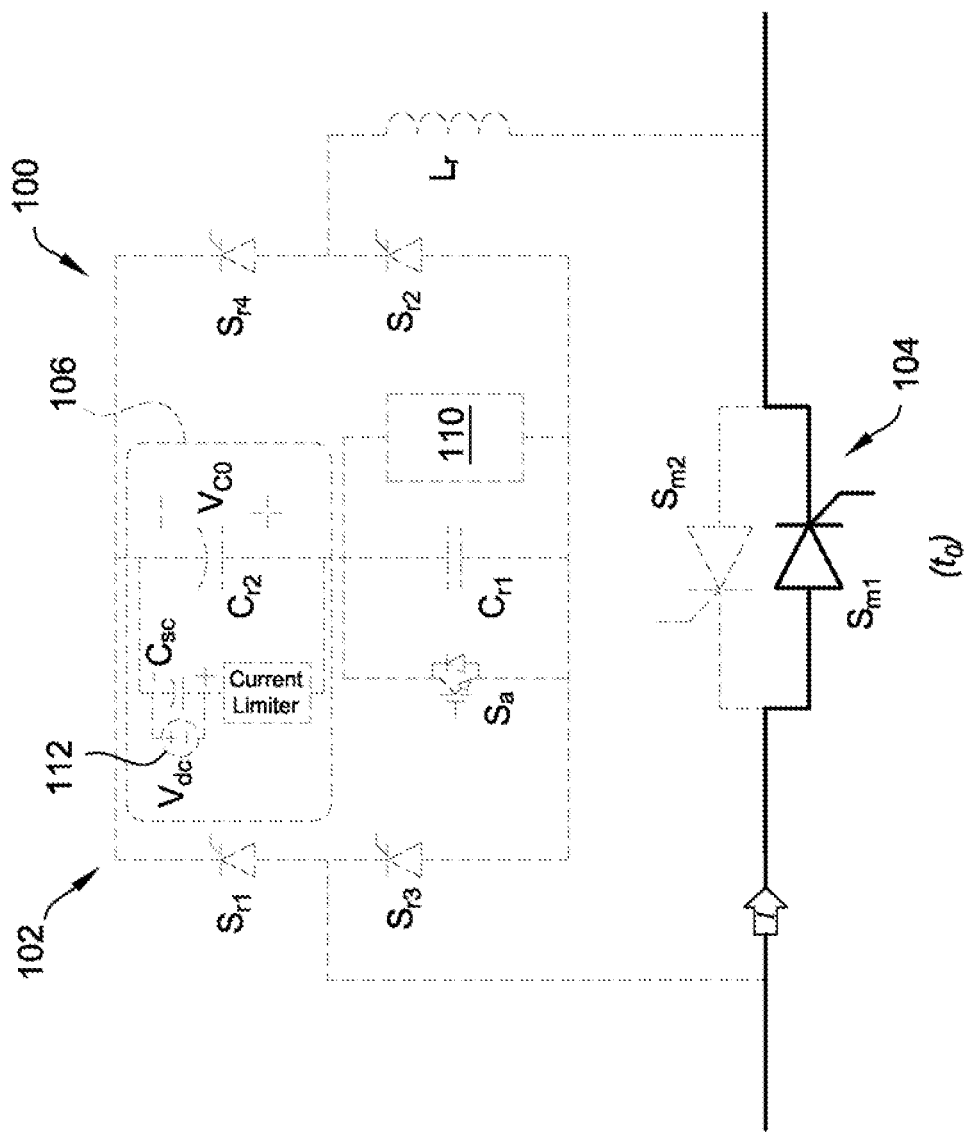
FIGS. 4-7 depict activation of the hybrid RTO unit, shown in FIG. 3, during a voltage source transfer.
Figure 5:
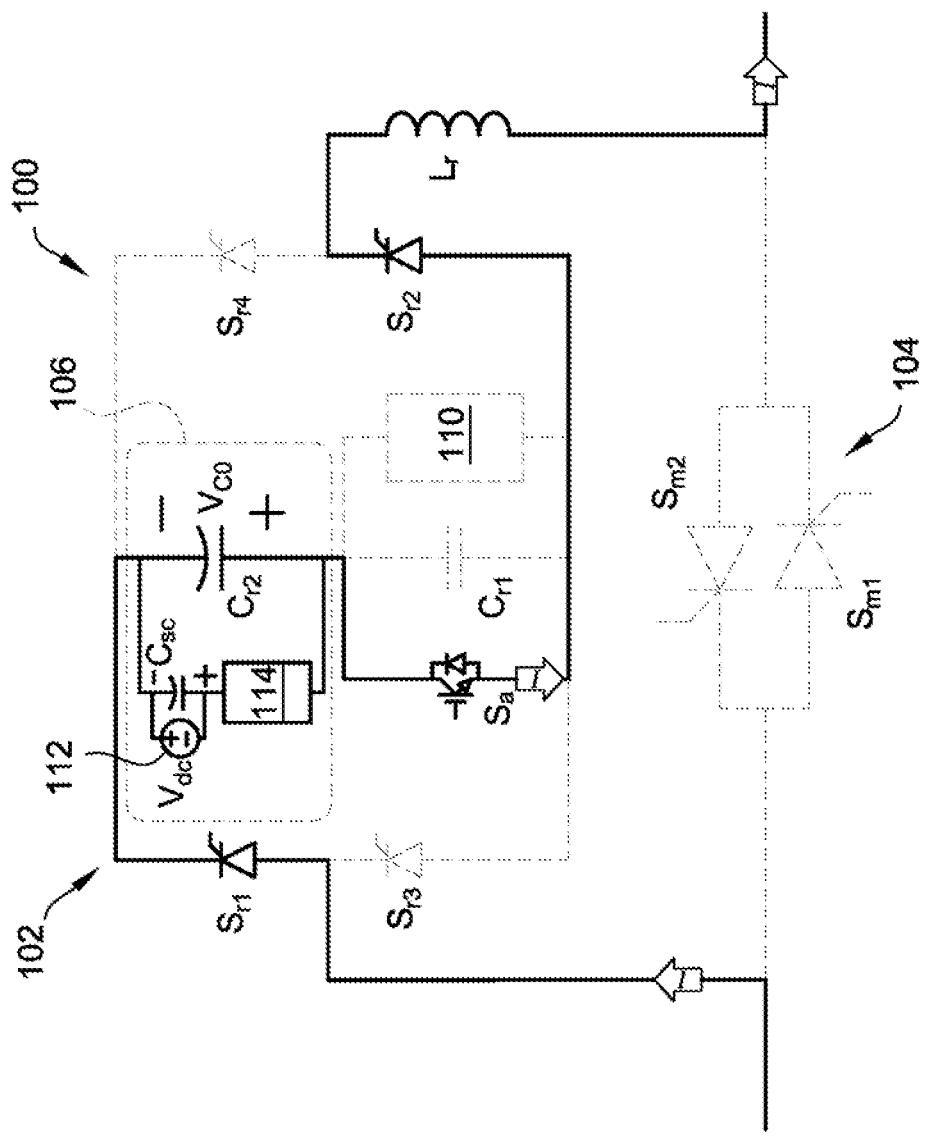

FIGS. 4-7 depict activation of the components of the STS 100, specifically of the hybrid RTO unit 102, during a voltage source transfer. In FIG. 4, operation of the STS 100 during a time period $t_0$ is shown. The main switch 104 is conducting the load current I. Once an issue with the quality of power from the operating power source is detected, the STS 100 initiates the voltage source transfer. During a time period $t_1$ of the transfer, depending on the initial direction of the load current I, or which of the main thyristors $S_{m1}$ and $S_{m2}$ is conducting, the corresponding auxiliary thyristors are triggered. In the embodiment depicted in FIGS. 4 and 5, because the main thyristor $S_{m1}$ is conducting the load current I during the time period $t_0$, the auxiliary thyristors $S_{r1}$ and $S_{r1}$, as well as the IGBT switch $S_a$, are activated to conduct the load current I and initiate the turn-off process for the hybrid RTO unit 102. Both of the capacitors $C_{r2}$ and $C_{sc}$ are providing resonant current during the time period $t_1$.

During the time period $t_1$, the load current I is forced to commutate from the main thyristor $S_{m1}$ to the RTO unit 102 by the pre-charged voltage of the capacitors $C_{r2}$ and $C_{sc}$. As described above, because the capacitor $C_{r2}$ has low internal resistance, the majority of the resonant current is provided by the capacitor $C_{r2}$, and only a small portion of the resonant current is provided by the capacitor $C_{sc}$. The load current I discharges the capacitors $C_{r2}$ and $C_{sc}$, and the voltages across both of the capacitors $C_{r2}$ and $C_{sc}$ decrease during this period. However, the voltage across the capacitor $C_{sc}$ will be higher after the discharge than the voltage across the capacitor $C_{r2}$ by the end of the time period $t_1$, due to the current limiter 114 and the higher internal resistance of the capacitor $C_{sc}$.

Figure 6:
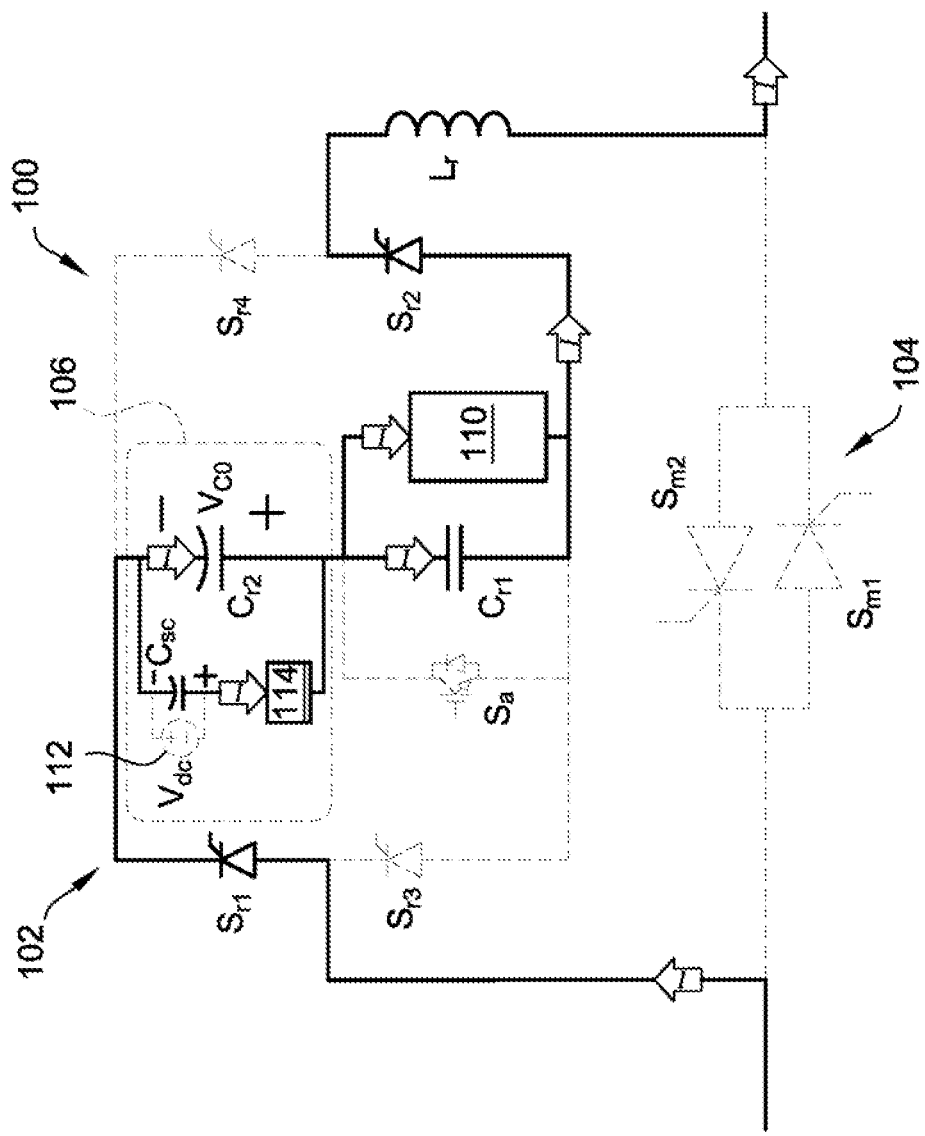

Turning now to FIG. 6, the operation of the RTO unit 102 during a time period $t_2$ is depicted. During the time period $t_2$, the auxiliary IGBT switch $S_a$ is turned off, and the voltage clamping component 110 is activated, to limit the voltage applied to the auxiliary IGBT switch $S_a$ and the resonant capacitor $C_{r1}$. At this point, the main thyristor $S_{m1}$ is enabled to block forward voltage, as shown in FIG. 6. The energy in the capacitor $C_{r2}$ is enough, during a first voltage source transfer, to maintain the voltage polarity and reverse bias to the main thyristor $S_{m1}$.

Figure 7:
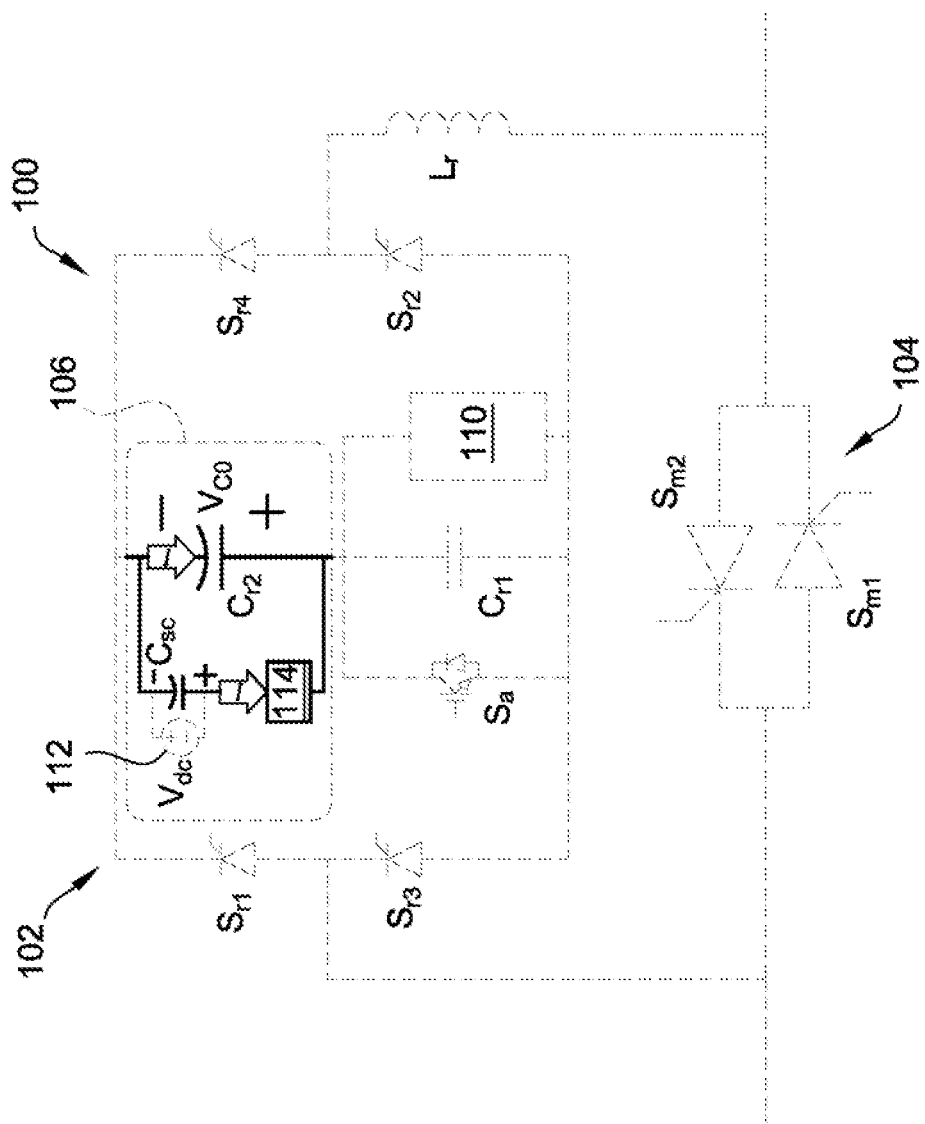

As shown in FIG. 7, during a time period $t_3$, the load current I is interrupted by the auxiliary thyristors $S_{r1}$ and $S_{r2}$, and the load is disconnected from the unsuitable power source. The capacitor $C_{sc}$ charges the capacitor $C_{r2}$, increasing the voltage across the capacitor $C_{r2}$ to accommodate a subsequent voltage source transfer that may occur substantially immediately (e.g., within milliseconds) thereafter. The time needed for the capacitor $C_{sc}$ to charge the capacitor $C_{r2}$ can be determined based on the respective initial voltage across each of the capacitors $C_{sc}$ and $C_{r2}$, the characteristics of the current limiter 114, the respective capacitance of each of the capacitors $C_{sc}$ and $C_{r2}$, the number of capacitors in series that are employed to implement the capacitor $C_{sc}$, and the number capacitors in parallel that are employed to implement the capacitor $C_{r2}$.

Figure 8:
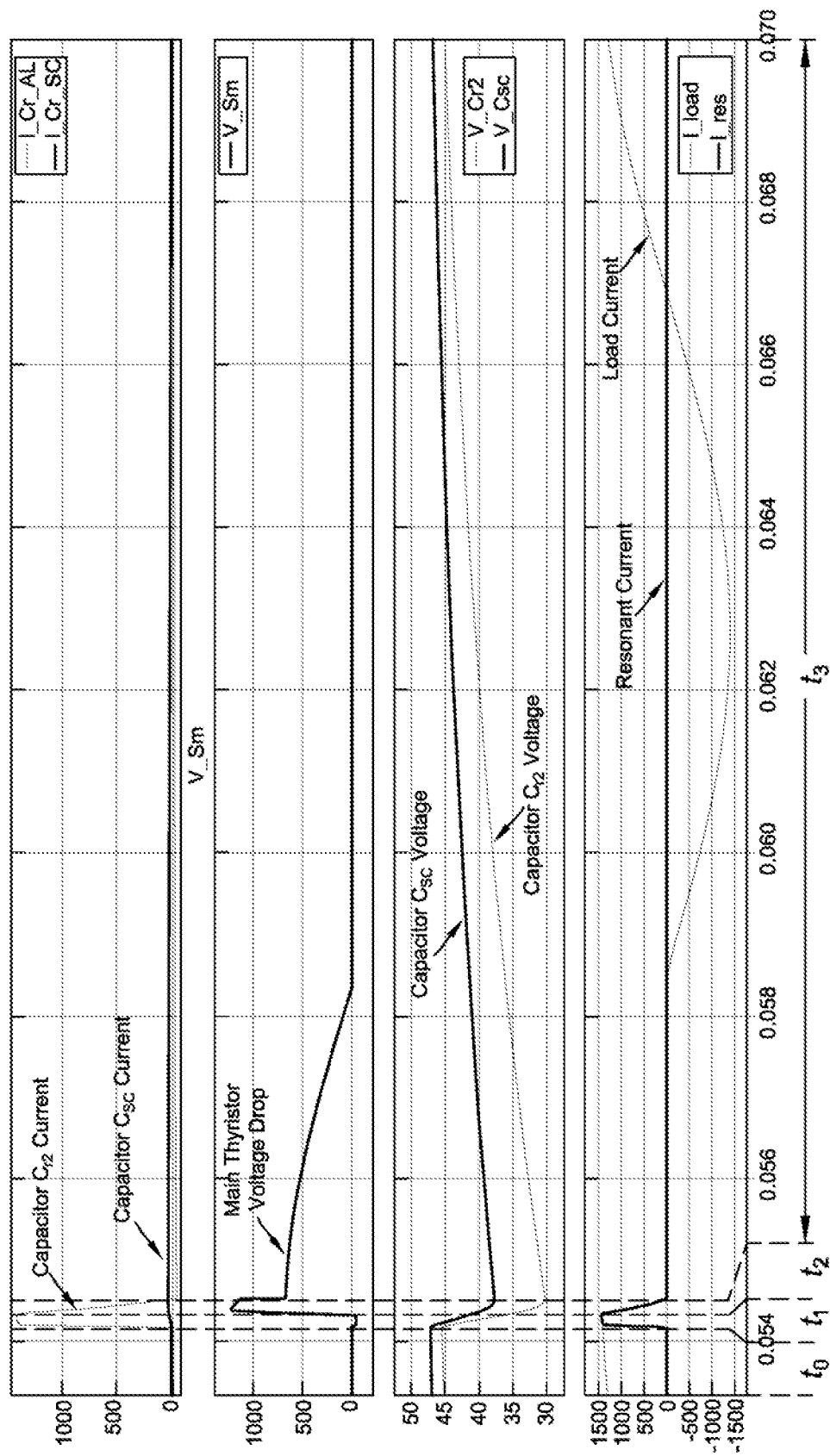
FIG. 8 depicts simulation waveforms for various components of the STS shown in FIG. 3 for a single voltage source transfer.

FIGS. 8-12 depict various waveforms of the components of the STS 100 over the time periods $t_0$-$t_3$. More particularly, FIG. 8 depicts simulation waveforms of the RTO unit 102 over the time periods $t_0$-$t_3$, for a single voltage source transfer, with simulation conditions including: the load peak current I is 1400 A, the capacitance of the capacitor $C_{r2}$ is 21 mF, the pre-charge voltage across the capacitor $C_{r2}$ and the capacitor $C_{sc}$ is 50 V, the clamping voltage of the voltage clamping component 110 is 1300V, and any system parasitic inductances are 100 µH.

Figure 1:
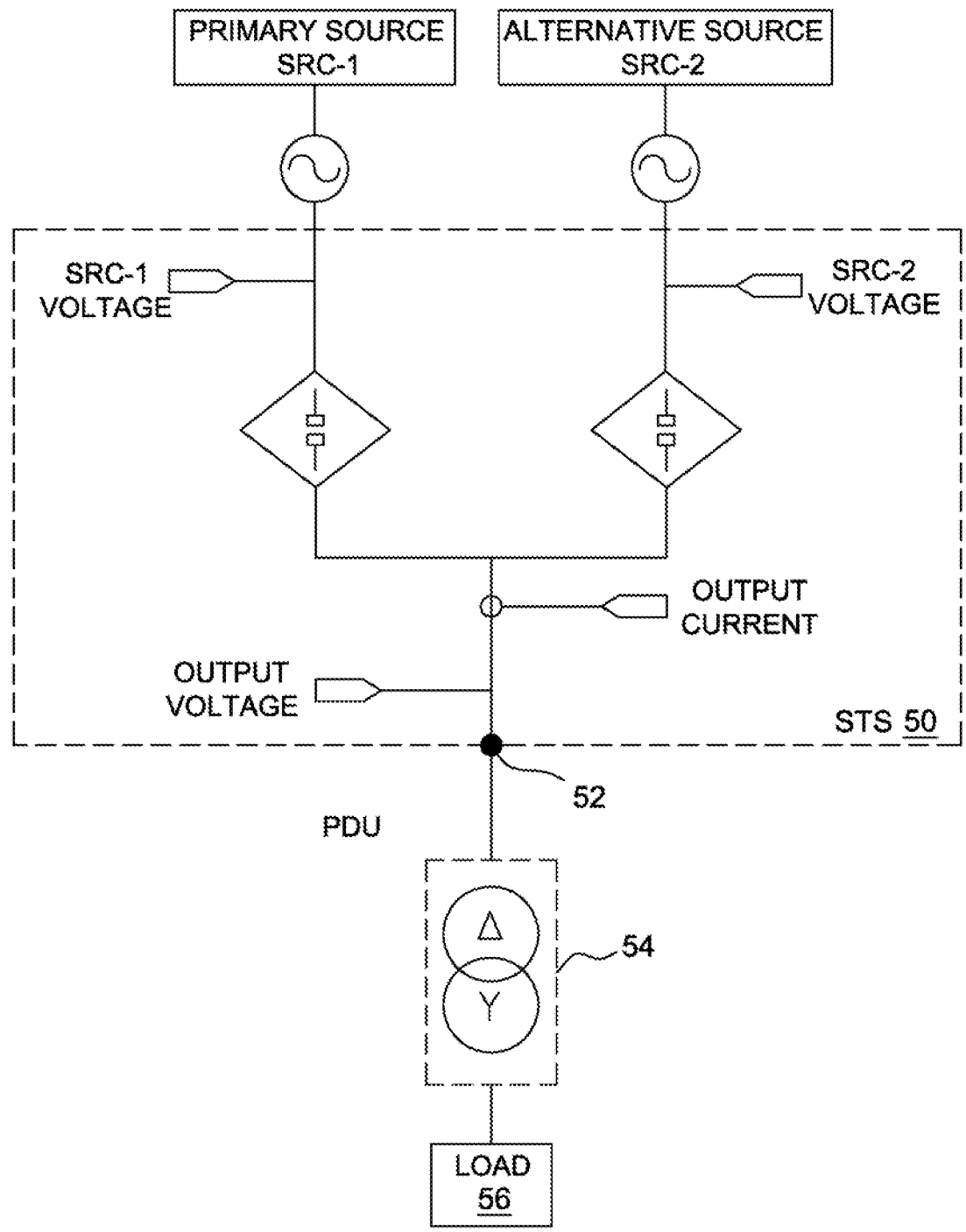
FIG. 1 is a schematic diagram of a static transfer switch (STS)
Figure 2:
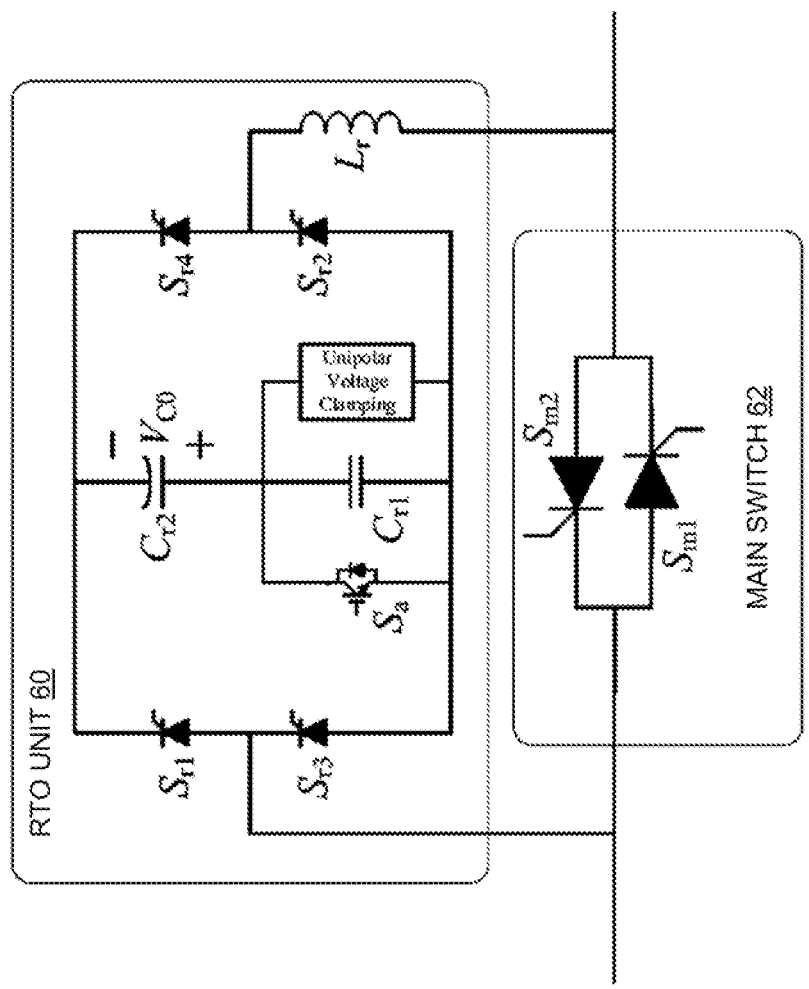
FIG. 2 is a schematic diagram of an STS including a resonant turn-off (RTO) unit in parallel with a main thyristor.
Figure 9:
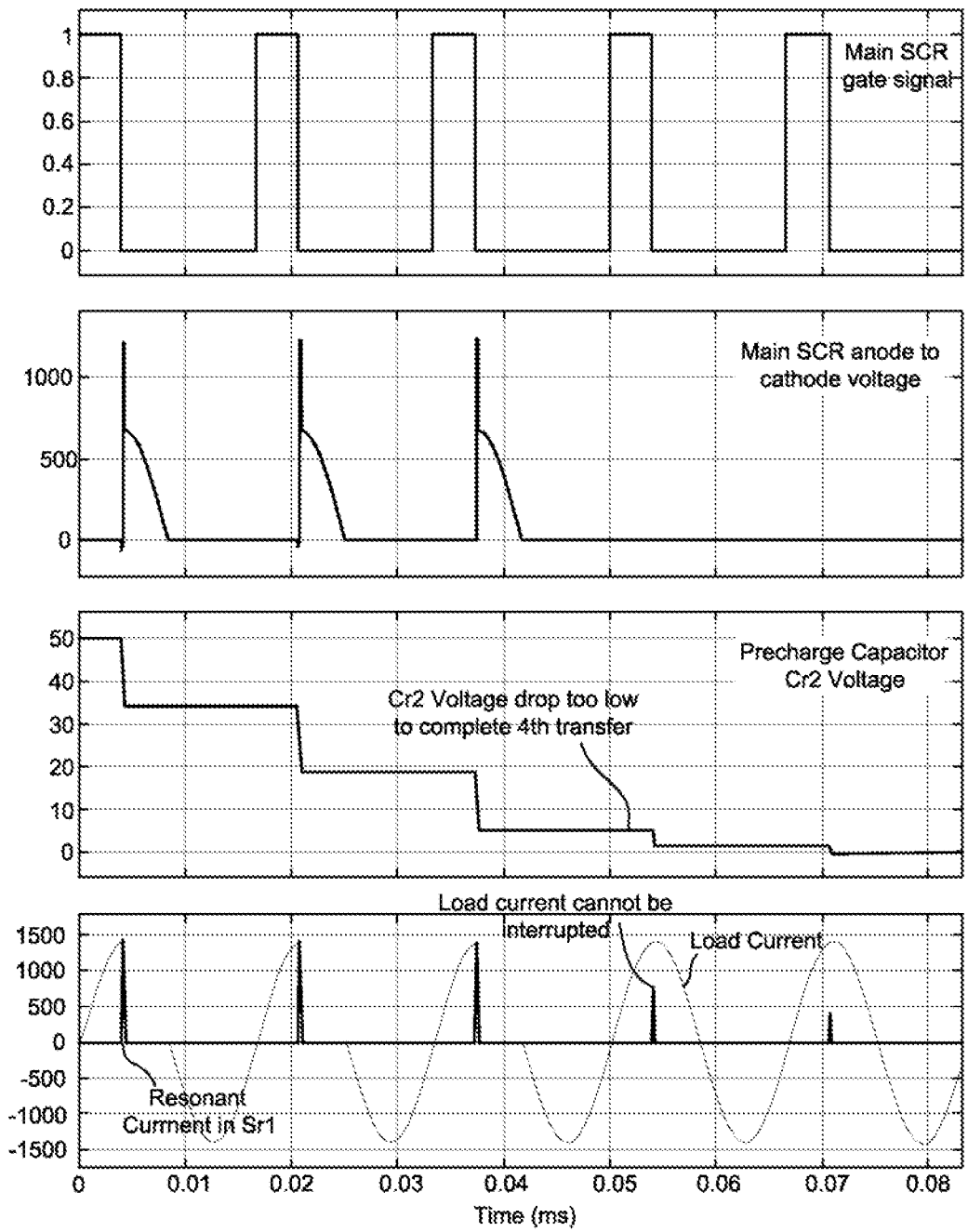
FIGS. 9 and 10 depict simulation waveforms for the STS shown in FIG. 2 across voltage source transfers.
Figure 10:
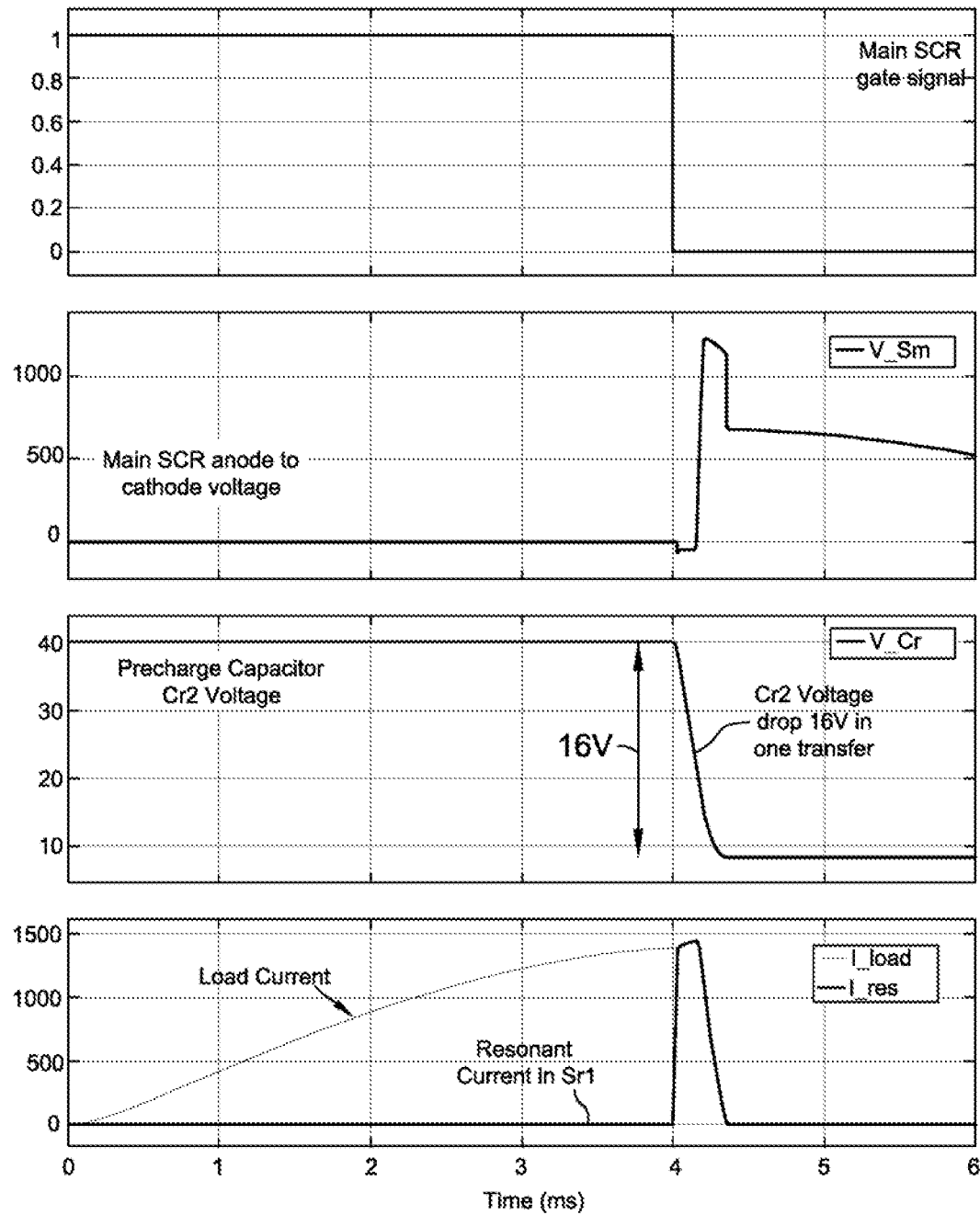
Figure 11A:
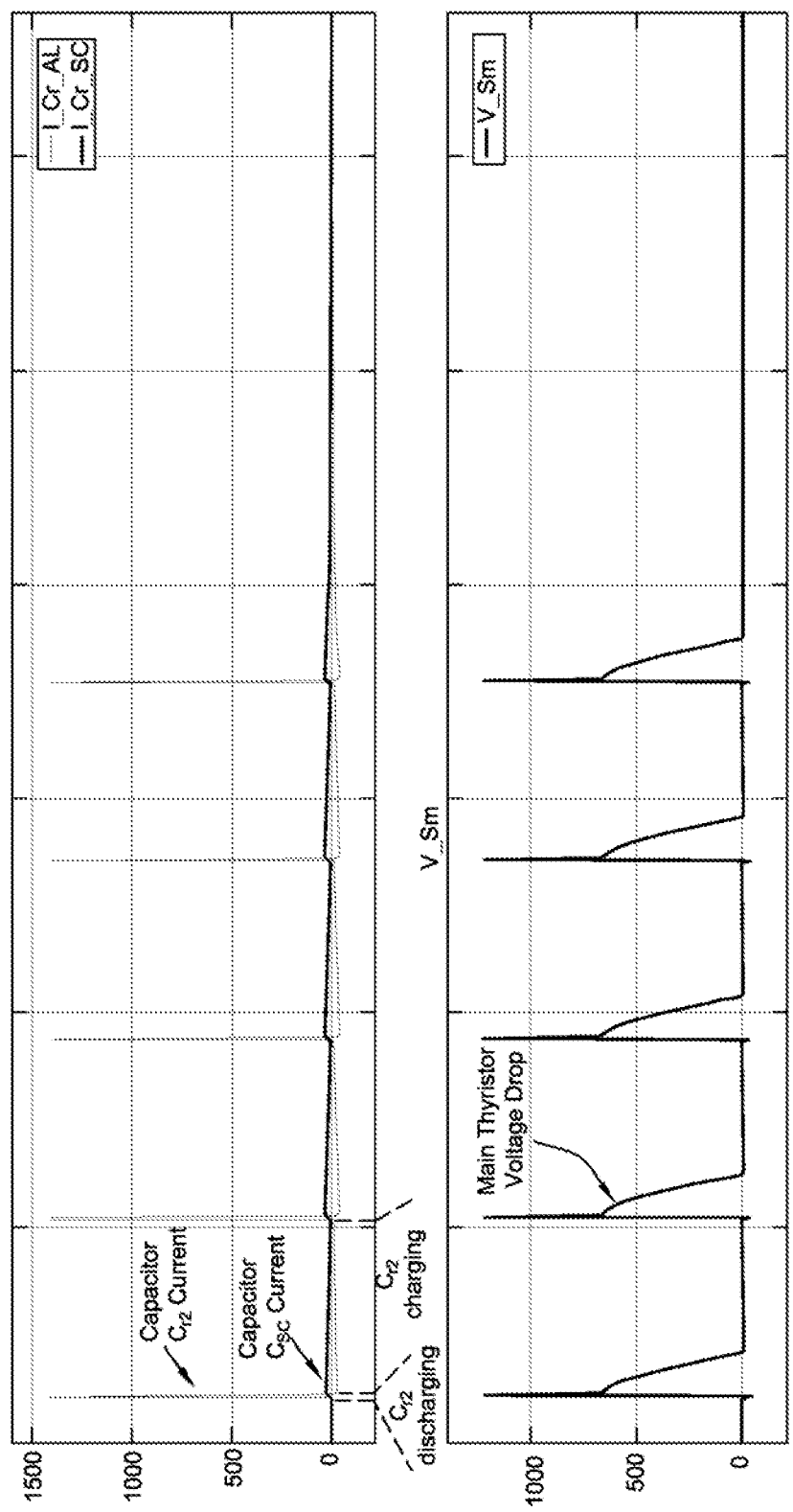
FIGS. 11A, 11B, 12A, and 12B depict simulation waveforms for the example STS shown in FIG. 3 according to the present disclosure, illustrating the capacity of the hybrid RTO unit to function across multiple consecutive voltage source transfers.
Figure 11B:
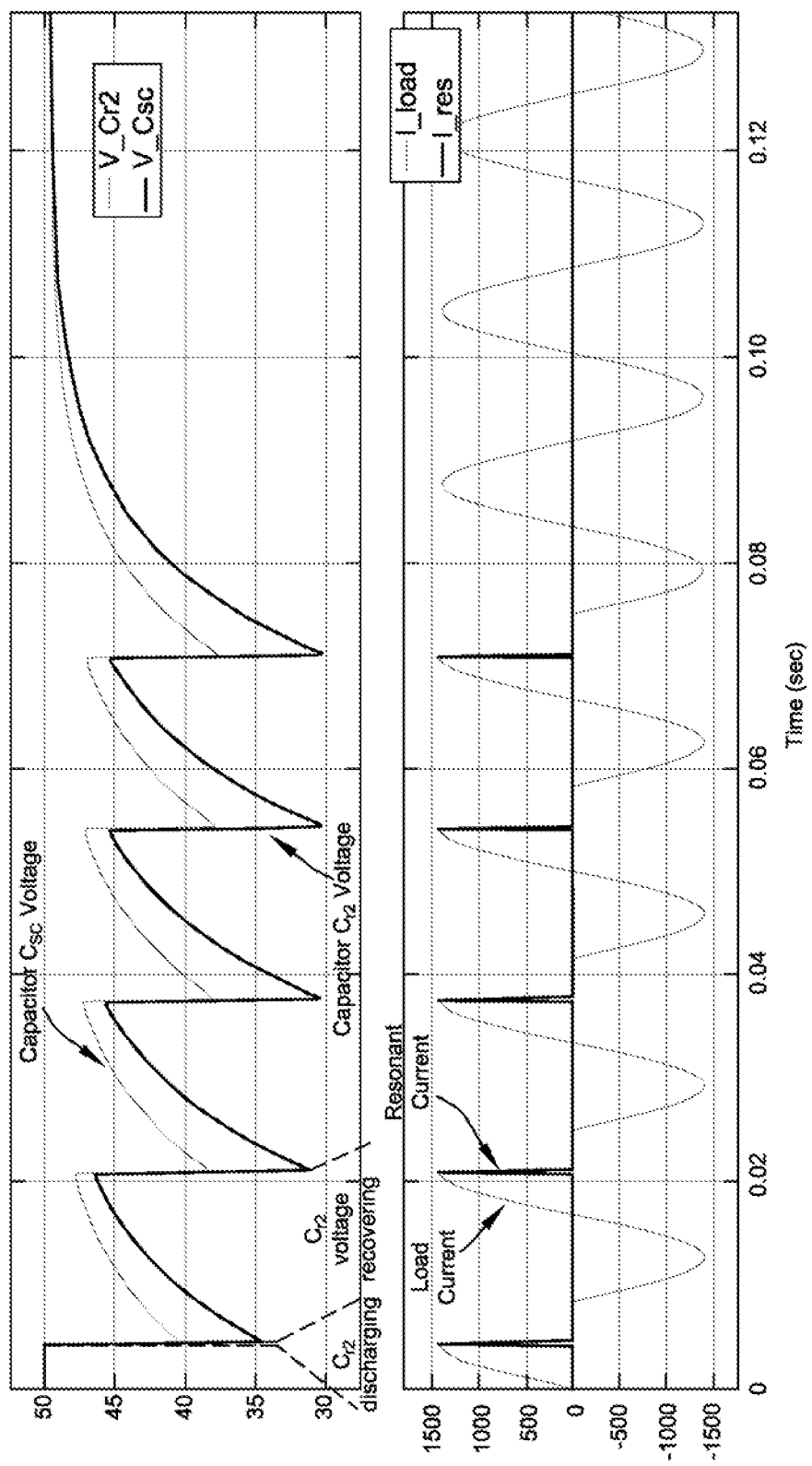
Figure 12A:
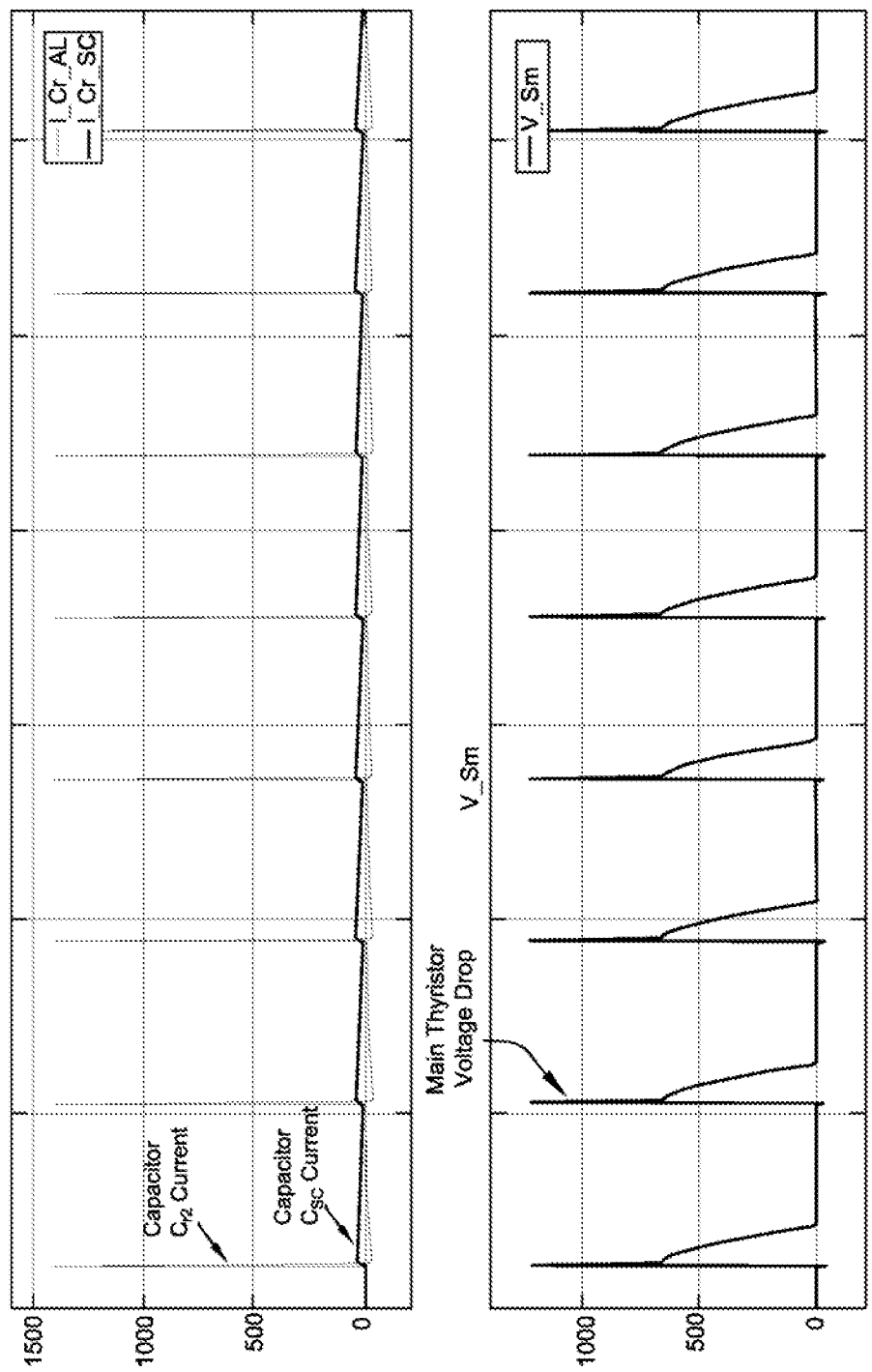
Figure 12B:
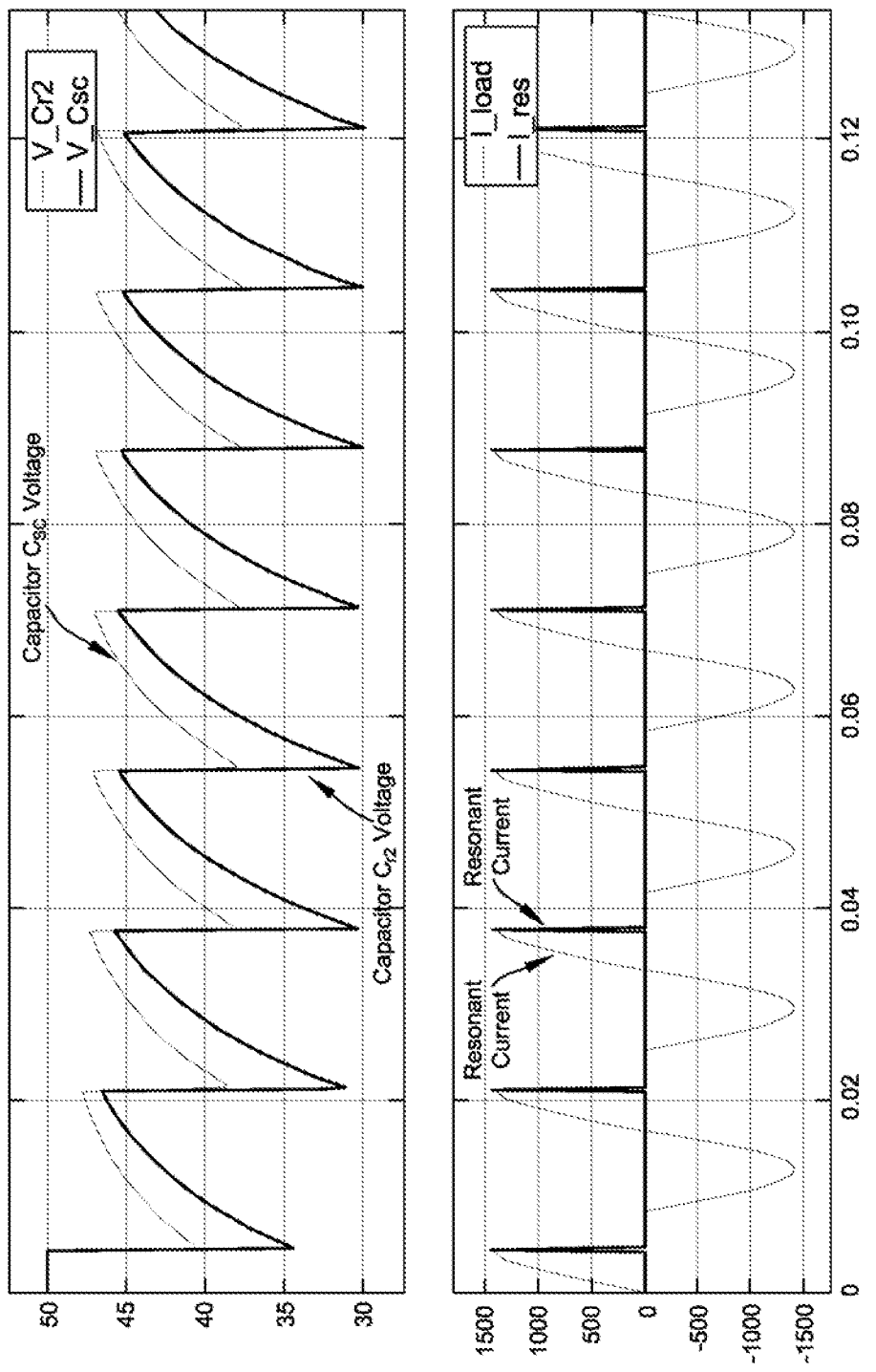

FIG. 9 depicts simulation waveforms of the STS 50, shown in FIG. 2, during multiple voltage source transfers, and FIG. 10 is an expanded view of those waveforms during the first of the voltage source transfers. The simulation conditions include: the load peak current I is 1400 A, the capacitance of the capacitor $C_{r2}$ is 21 mF, the pre-charge voltage across the capacitor $C_{r2}$ is 50 V, the clamping voltage of the voltage clamping component 110 is 1300V, and any system parasitic inductances are 100 µH. As shown in FIG. 9, the known STS 50 is subject to five consecutive current interruptions, to induce a voltage source transfer. However, the voltage across the capacitor $C_{r2}$ decreases too much during each voltage source transfer (see voltage drop from 50 V to 34 V in FIG. 10). Therefore, the known RTO unit 60 does not suitably function beyond the third current interruption, because the voltage across the capacitor $C_{r2}$ is then too low to interrupt the load current I.

In contrast to FIGS. 9 and 10, FIGS. 11A, 11B, 12A, and 12B depict simulation waveforms of the STS 100 of the present disclosure, shown in FIGS. 3-7, illustrating the capacity of the hybrid RTO unit 102 of the STS switch 100 to function across multiple consecutive voltage source transfers. The simulation conditions for FIGS. 11A, 11B, 12A, and 12B are the same, except the STS 100 is subject to five simulated voltage source transfers to produce the waveforms shown in FIGS. 11A and 11B, and the STS 100 is subjected to eight simulated voltage source transfers to produce the waveforms shown in FIGS. 12A and 12B. The simulation conditions include: the load peak current I is 1400 A, the capacitance of the capacitor $C_{r2}$ is 21 mF, the capacitance of the capacitor $C_{sc}$ is 100 F (wherein the capacitor $C_{cs}$ is rated at 2.85V), the pre-charge voltage across the each of capacitors $C_{r2}$ and $C_{cs}$ is 50 V, the clamping voltage of the voltage clamping component 110 is 1300V, and any system parasitic inductances are 100 µH. As depicted in these simulation waveforms, the hybrid RTO unit 102 is capable of functioning across five or eight consecutive voltage source transfers, because the capacitor $C_{cs}$ facilitates maintaining the voltage across the capacitor $C_{r2}$ above 30 V during each transfer. In particular, the voltage across both of the capacitors $C_{r2}$ and $C_{cs}$ are recovered to above 45 V, and maintained at these voltage levels, upon and beyond three transfer cycles.

It is contemplated that the hybrid RTO unit 102 may be capable of functioning for more than eight voltage transfer cycles, such as more than 10 cycles, more than 50 cycles, or even more than 100 cycles. Accordingly, the hybrid RTO unit 102, and the STS 100 in which the hybrid RTO unit 102 is implemented, provides a reliable, compact, and cost-effective STS 100 that solves some known disadvantages of STS's, as described herein. Moreover, the ability to operate during multiple consecutive voltage source transfers is realized without significant reduction in switching time.

Figure 13:
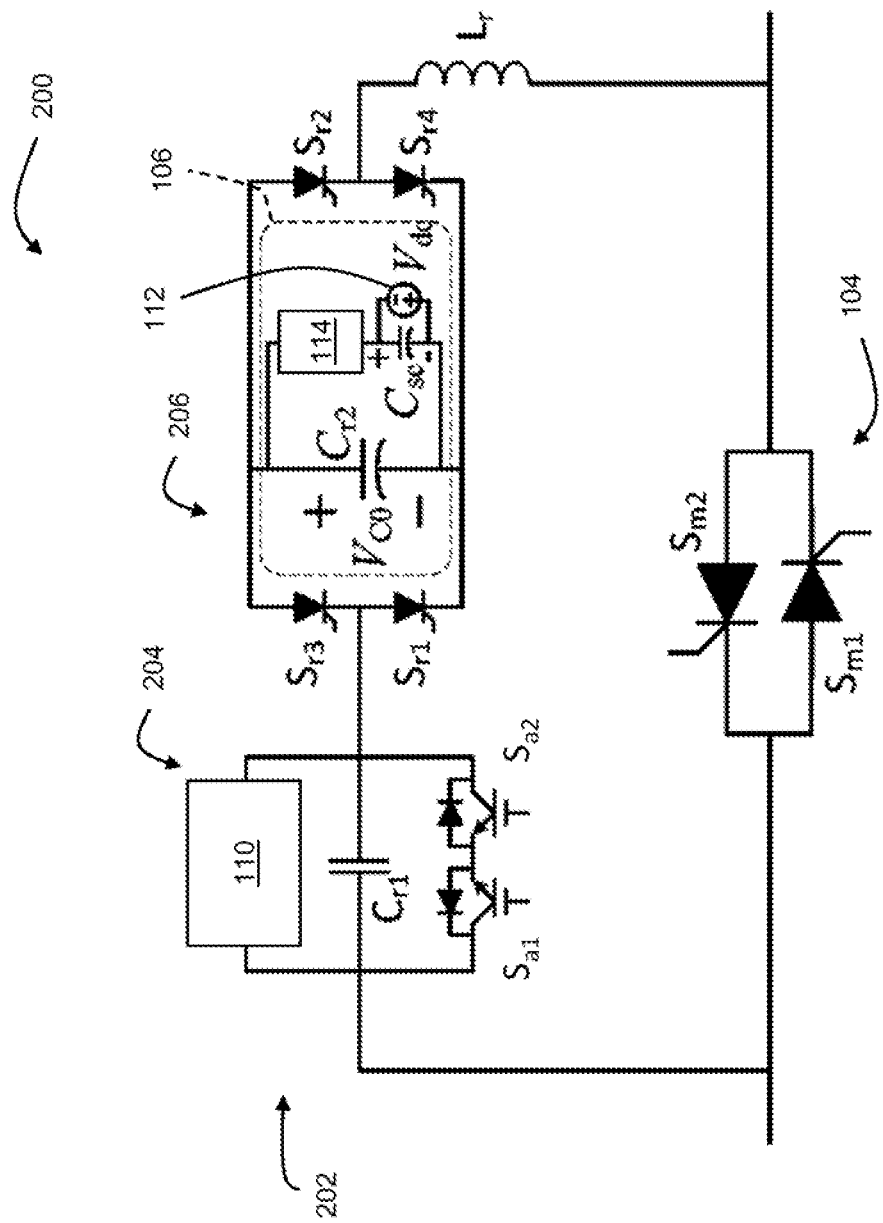
FIG. 13 is a schematic diagram of another example embodiment of an STS including an RTO unit in accordance with the present disclosure.

It is further contemplated that the benefits of the hybrid RTO unit 102 may be realized in circuits other than the STS 100 shown in FIGS. 3-7. For example, another circuit, specifically another example STS 200, is shown in FIG. 13. The STS 200 includes the main switch 104 and the resonant inductor $L_r$. In this embodiment, the topology of the hybrid RTO unit has changed, such that the hybrid RTO unit is referred to with the reference numeral 202. The hybrid RTO unit 202 includes an auxiliary switch 204 in series with a re-charging unit 206. The auxiliary switch 204 includes two anti-series IGBT switches $S_{a1}$ and $S_{a2}$ in parallel with the capacitor $C_{r1}$ and the voltage clamping device 110. The re-charging unit 206 includes the auxiliary thyristor switches $S_{r1}$, $S_{r2}$, $S_{r3}$, and $S_{r4}$ forming a bridge for the resonant capacitor sub-unit 106. The functionality of the components of the hybrid RTO unit 202 is similar to that described herein with respect to the hybrid RTO unit 102.

Figure 14:
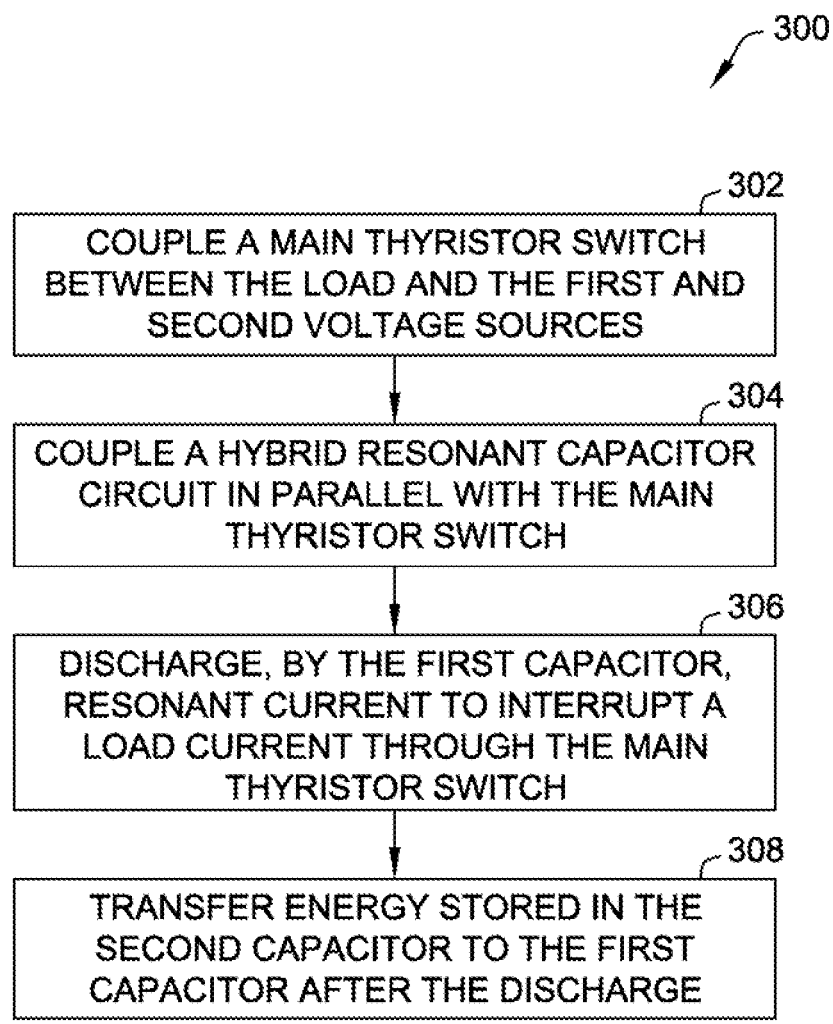
FIG. 14 is a flow diagram of a method for facilitating multiple consecutive voltage source transfers between a first voltage source and a second voltage source powering a load, using the STS shown in FIG. 3.

FIG. 14 is a flow diagram of a method 300 for facilitating multiple consecutive voltage source transfers between a first voltage source and a second voltage source powering a load. In the example embodiment, the method 300 includes coupling 302 a main thyristor switch between the load and the first and second voltage sources, and coupling 304 a hybrid resonant capacitor circuit in parallel with the main thyristor switch, the hybrid resonant capacitor circuit including a first capacitor, a second capacitor coupled in parallel with the first capacitor, and a current limiter coupled in series with the second capacitor. The method 300 also includes discharging 306, by the first capacitor, resonant current to interrupt a load current through the main thyristor switch, and transferring 308 energy stored in the second capacitor to the first capacitor after the discharging 306.

The method 300 may include additional, fewer, or alternative steps. For example, the method 300 may also include pre-charging each of the first and second capacitors to a respective initial voltage. In some instances, the pre-charging includes pre-charging each of the first and second capacitors to the same initial voltage. In some embodiments, the method 300 includes discharging a second, lower amount of resonant current from the second capacitor. In some embodiments, the method 300 includes coupling a low-voltage power supply across the second capacitor, and/or coupling a plurality of auxiliary thyristor in a bridge configuration across the hybrid resonant capacitor circuit.

Example embodiments of hybrid resonant turn-off unit, as well as methods of operating a circuit including such an RTO unit, are described in detail. The circuits and methods are not limited to the specific embodiments described herein, but rather, components of systems and/or steps of the methods may be utilized independently and separately from other components and/or steps described herein. For example, the method may also be used in combination with other components and are not limited to practice only with the circuits as described herein. Rather, the example embodiment can be implemented and utilized in connection with many other applications.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

This written description uses examples to disclose the embodiments, including the best mode, and also to enable any person skilled in the art to practice the embodiments, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A hybrid resonant capacitor circuit comprising:
a first capacitor;
a second capacitor coupled in parallel with the first capacitor; and
a current limiter coupled in series with the second capacitor,
wherein the first capacitor is configured to discharge resonant current to interrupt a load current to a switch in parallel with the hybrid resonant capacitor circuit including the first and second capacitors, and
wherein the second capacitor is configured to transfer energy stored in the second capacitor to the first capacitor after discharge of the resonant current from the first capacitor.

2. The circuit of claim 1, wherein the second capacitor has a higher capacitance and a lower pulse current capability than the first capacitor.

3. The circuit of claim 1, wherein a low-voltage power supply is configured to maintain a threshold voltage across the second capacitor.

4. The circuit of claim 1, wherein the current limiter is a resistor or a semiconductor switch.

5. The circuit of claim 1, wherein the first and second capacitor are each configured to be pre-charged to a respective initial voltage.

6. The circuit of claim 5, wherein the initial voltage for each of the first and second capacitors is the same.

7. A static transfer switch comprising:
a thyristor switch; and
a hybrid resonant capacitor circuit connected in parallel to the thyristor switch, the hybrid resonant capacitor circuit comprising:
a first capacitor configured to discharge resonant current to interrupt a load current to the thyristor switch;
a second capacitor coupled in parallel with the first capacitor, wherein the second capacitor is configured to transfer energy stored in the second capacitor to the first capacitor after discharge of the resonant current from the first capacitor; and
a current limiter coupled in series with the second capacitor.

8. The static transfer switch of claim 7, further comprising an auxiliary switch in series with the hybrid resonant capacitor circuit, the auxiliary switch comprising a semiconductor switch in parallel with a third capacitor and a voltage clamping component.

9. The static transfer switch of claim 8, further comprising:
a plurality of auxiliary thyristor switches forming a bridge across the hybrid resonant capacitor circuit and the auxiliary switch.

10. The static transfer switch of claim 7, wherein the second capacitor has a higher capacitance and a lower pulse current capability than the first capacitor.

11. The static transfer switch of claim 7, wherein a low-voltage power supply is configured to maintain a threshold voltage across the second capacitor.

12. The static transfer switch of claim 7, wherein the current limiter is a resistor or a semiconductor switch.

13. The static transfer switch of claim 7, wherein the first and second capacitor are each configured to be pre-charged to a respective initial voltage.

14. The static transfer switch of claim 13, wherein the initial voltage for each of the first and second capacitor is the same.

15. A method for facilitating multiple consecutive voltage source transfers between a first voltage source and a second voltage source powering a load, the method comprising:
coupling a main thyristor switch between the load and the first and second voltage sources;
coupling a hybrid resonant capacitor circuit in parallel with the main thyristor switch, the hybrid resonant capacitor circuit including a first capacitor, a second capacitor coupled in parallel with the first capacitor, and a current limiter coupled in series with the second capacitor;
discharging, by the first capacitor, resonant current to interrupt a load current through the main thyristor switch; and
transferring energy stored in the second capacitor to the first capacitor after the discharging.

16. The method of claim 15, further comprising pre-charging each of the first and second capacitors to a respective initial voltage.

17. The method of claim 16, wherein the pre-charging comprises pre-charging each of the first and second capacitors to the same initial voltage.

18. The method of claim 15, further comprising discharging a second, lower amount of resonant current from the second capacitor.

19. The method of claim 15, further comprising coupling a low-voltage power supply across the second capacitor.

20. The method of claim 15, further comprising coupling a plurality of auxiliary thyristors in a bridge configuration across the hybrid resonant capacitor circuit.

* * * * *